(12) United States Patent
Choi et al.

(10) Patent No.: US 7,955,890 B2
(45) Date of Patent: Jun. 7, 2011

(54) METHODS FOR FORMING AN AMORPHOUS SILICON FILM IN DISPLAY DEVICES

(75) Inventors: Soo Young Choi, Fremont, CA (US); Jriyan Jerry Chen, Santa Clara, CA (US); Tae Kyung Won, San Jose, CA (US); Dong-Kil Yim, Sungnam (KR)

(73) Assignee: Applied Materials, Inc., Santa Clara, CA (US)

( * ) Notice: Subject to any disclaimer, the term of this patent is extended or adjusted under 35 U.S.C. 154(b) by 71 days.

(21) Appl. No.: 12/486,435

(22) Filed: Jun. 17, 2009

(65) Prior Publication Data
US 2009/0315030 A1 Dec. 24, 2009

Related U.S. Application Data

(60) Provisional application No. 61/075,187, filed on Jun. 24, 2008.

(51) Int. Cl.
*H01L 21/00* (2006.01)

(52) U.S. Cl. .............. 438/93; 438/96; 438/97; 438/485; 438/488; 257/E21.009; 257/E21.133; 257/E21.411; 257/E21.413; 257/E25.007; 257/E29.083; 257/E29.293; 257/E29.294; 257/E31.047; 257/E31.048

(58) Field of Classification Search ............. 438/30, 438/71–74, 93–97, 485–488; 257/E21.009, 257/51, 101, 133, 351, 411–413, 25.007, 257/29.083, 293–294, 31.039, 47–48
See application file for complete search history.

(56) References Cited

U.S. PATENT DOCUMENTS

| | | | |
|---|---|---|---|
| 4,379,943 A * | 4/1983 | Yang et al. ............. | 136/249 |
| 4,891,074 A * | 1/1990 | Ovshinsky et al. ...... | 136/249 |
| 5,403,772 A * | 4/1995 | Zhang et al. ........... | 438/166 |
| 5,646,050 A | 7/1997 | Li et al. | |
| 5,869,791 A | 2/1999 | Young | |
| 6,309,906 B1 * | 10/2001 | Meier et al. ............ | 438/69 |
| 6,326,304 B1 | 12/2001 | Yoshimi et al. | |
| 7,023,503 B2 | 4/2006 | den Boer | |

(Continued)

FOREIGN PATENT DOCUMENTS
WO WO-2007-149945 A2 12/2007

OTHER PUBLICATIONS
Fang, et al, "A Metal-Amorphous Silicon Germanium Alloy Schottky Barrier for Infrared Optoelectronic IC on Glass Substrate Application", IEEE Transactions on Electron Devices, vol. 39, No. 6, p. 1350-1354, Jun. 1992.

(Continued)

*Primary Examiner* — Michael S Lebentritt
(74) *Attorney, Agent, or Firm* — Patterson & Sheridan, L.L.P.

(57) ABSTRACT

Embodiments of the present invention relate to methods for depositing an amorphous film that may be suitable for using in a NIP photodiode in display applications. In one embodiment, the method includes providing a substrate into a deposition chamber, supplying a gas mixture having a hydrogen gas to silane gas ratio by volume greater than 4 into the deposition chamber, maintaining a pressure of the gas mixture at greater than about 1 Torr in the deposition chamber, and forming an amorphous silicon film on the substrate in the presence of the gas mixture, wherein the amorphous silicon film is configured to be an intrinsic-type layer in a photodiode sensor.

19 Claims, 4 Drawing Sheets

U.S. PATENT DOCUMENTS

| | | |
|---|---|---|
| 7,046,282 B1 * | 5/2006 | Zhang et al. ............... 348/294 |
| 7,280,167 B2 | 10/2007 | Choi et al. |
| 7,358,192 B2 | 4/2008 | Merry et al. |
| 7,514,762 B2 * | 4/2009 | Deane ..................... 257/538 |
| 7,767,974 B2 * | 8/2010 | Jung et al. ............. 250/370.09 |
| 2007/0171512 A1 | 7/2007 | Lee |
| 2007/0200835 A1 | 8/2007 | Choo et al. |
| 2007/0262311 A1 | 11/2007 | Liu et al. |
| 2008/0020500 A1 | 1/2008 | Park et al. |
| 2008/0029767 A1 | 2/2008 | Nagata et al. |
| 2008/0030484 A1 | 2/2008 | Cho et al. |
| 2008/0042131 A1 | 2/2008 | Morimoto et al. |
| 2008/0073490 A1 | 3/2008 | Koide |
| 2008/0100587 A1 | 5/2008 | Sano et al. |
| 2008/0116454 A1 | 5/2008 | Shimizu |
| 2008/0116787 A1 | 5/2008 | Hsu et al. |
| 2009/0020154 A1 * | 1/2009 | Sheng et al. ............... 136/255 |
| 2010/0051098 A1 * | 3/2010 | Sheng et al. ............... 136/256 |
| 2010/0059110 A1 * | 3/2010 | Sheng et al. ............... 136/255 |
| 2010/0258169 A1 * | 10/2010 | Sheng et al. ............... 136/255 |
| 2010/0275996 A1 * | 11/2010 | Tawada et al. ............. 136/258 |

OTHER PUBLICATIONS

Sakamoto, et al, "High Speed and High Resolution ISO A4 size Amorphous Si:H Contact Linear Image Sensor", IEEE Transactions on Components, Hybrids, and Manufacturing Technology, vol. Chmt-7 No. 4, pp. 429-433, Dec. 1984.

Fang, et al, "An Amorphous SiC/Si Heterojunction p-i-n. Diode for Low-Noise and High-Sensitivity UV Detector", IEEE Transactions on Electron Devices, vol. 39, No. 2, p. 292-296, Feb. 1992.

Ossenbrink, et al, "Building Integration of an Amorphous Silicon Photovoltaic Facade", IEEE First WCPEC, Dec. 5-9, 1994, Hawaii.

Deimel, et al, "Amorphous SiGe:H Photodetectors on Glass Optical Waveguides", IEEE Photonics Technology Letters, vol. 2 No. 7 p. 499-501, Jul. 1990.

Hayama, "Characteristics of p-i Junction Amorphous Silicon Stripe-Type Photodiode Array and its Application to Contact Image Sensor", IEEE Transactions on Electron Devices, vol. 37, No. 5, p. 1271-1279, May 1990.

PCT International Search Report and Written Opinion of PCT/US2009/047780 dated Feb. 3, 2010.

* cited by examiner

METHODS FOR FORMING AN AMORPHOUS SILICON FILM IN DISPLAY DEVICES

CROSS REFERENCE TO RELATED APPLICATIONS

This application claims benefit of U.S. Provisional Patent Application Ser. No. 61/075,187, filed Jun. 24, 2009, which is incorporated by reference in its entirety.

BACKGROUND OF THE INVENTION

1. Field of the Invention

Embodiments of the present invention generally relate to forming an amorphous silicon film. More particularly, embodiments of the present invention relate to forming an amorphous silicon film utilized in display devices.

2. Description of the Related Art

Display devices have been widely used for a wide range of electronic applications, such as mobile phone, mp3 players, e-book, and personal digital assistants (PDAs) and the like. The display device is generally designed for obtaining desired image signals by applying an electric field to a liquid crystal that fills a gap between two substrates and has anisotropic dielectric constant that controls the intensity of the dielectric field. By adjusting the amount of light transited through the substrates, the light and image intensity, quality and power consumption may be efficiently controlled.

Recently, touch screen panels (TSP) have become widely used as input means that reads the coordinates of the point touched by the user. A variety of different display devices, such as active matrix liquid crystal display (AMLCD) or an active matrix organic light emitting diodes (AMOLED), may be employed as light sources of display device which have touch screen panels attached and integrated thereto. The display devices employ photosensitive elements, such as an silicon based NIP photodiode. The photosensitive element is coupled to a readout switch, such as thin film transistor (TFT), that provides data indicative of received light. As thin film transistor (TFT) are utilized in active matrix liquid crystal displays (AMLCD) or active matrix organic light emitting diodes (AMOLED), each thin film transistor (TFT) functions as a switch for a pixel in a matrix display. NIP diodes and thin film transistor (TFT) utilize a-Si, polycrystalline silicon or other silicon-containing films as a semiconductor material. However, current practice for integrating of the touch screen panels (TSP) to NIP photo diodes and thin film transistors (TFTs) in liquid crystal displays (LCD) or organic light emitting diodes (OLEDs) suffers high manufacture cost, poor reliability, low display transmittance, and limited service life.

Therefore, there is a need for an improved integrated touch screen technology that provides high optical performance, long device lifetime, and low manufacturing cost.

SUMMARY OF THE INVENTION

Embodiments of the present invention relate to methods for depositing an amorphous film that may be suitable for use in a NIP photodiode display applications. In one embodiment, the method includes providing a substrate into a deposition chamber, supplying a gas mixture having a hydrogen gas to silane gas ratio by volume greater than 4 into the deposition chamber, maintaining a pressure of the gas mixture at greater than about 1 Torr in the deposition chamber, and forming an amorphous silicon film on the substrate in the presence of the gas mixture, wherein the amorphous silicon film is configured to be an intrinsic-type layer in a photodiode sensor.

In another embodiment, an amorphous based photodiode sensor includes a metal electrode layer disposed on a substrate, an n-type amorphous silicon layer disposed on the metal electrode layer, an intrinsic type amorphous silicon layer disposed on the n-type amorphous silicon layer, wherein the intrinsic type amorphous silicon layer is deposited from a gas mixture having a hydrogen gas to silane gas ratio by volume greater than 4, and a p-type amorphous silicon layer disposed on the intrinsic type amorphous silicon layer, wherein the n-type, intrinsic type and p-type amorphous silicon layers form a photodiode sensor on the substrate.

In yet another embodiment, a method of forming an amorphous-based photodiode sensor includes forming a n-type amorphous silicon layer on a substrate, forming an intrinsic type amorphous silicon layer on the substrate, and forming a p-type amorphous silicon layer on the substrate, wherein the n-type amorphous silicon layer, intrinsic type amorphous silicon layer and the p-type amorphous silicon layer are laterally spaced and sequentially formed on the substrate, and the n-type, intrinsic type and p-type amorphous silicon layers form a photodiode sensor on the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings.

Figure 1:
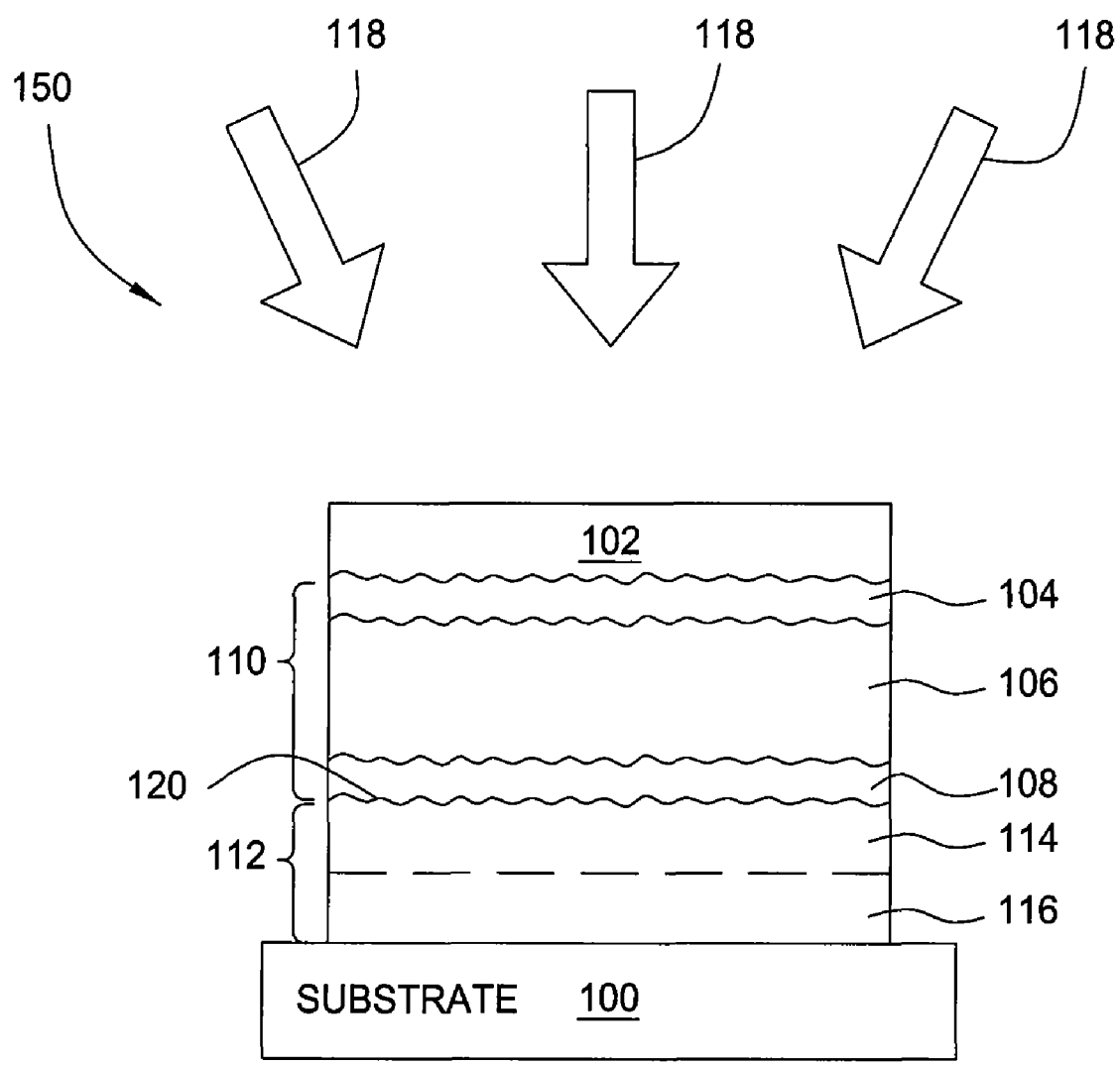
FIG. 1 is a schematic diagram of an embodiment of a single junction NIP photodiode.

It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

Embodiments of the present invention provide a method of depositing an amorphous silicon film that may be used in LCD devices with integrated optical input functions, such as a touch panel, utilizing a NIP photodiode. The thin film transistors (TFT) and the photodiodes are integrated fabricated on a substrate that improves optical input functions on the device. The improved amorphous silicon (a-Si) film provides high photo sensitivity to the device where the amorphous silicon is employed to improved overall device performance.

FIG. 1 is a schematic diagram of an embodiment of amorphous silicon (a-Si) based photodiode 150. The photodiode 150 includes a substrate 100, such as a glass substrate, polymer substrate, metal substrate, singled substrate, roll-to-roll substrate or other suitable substrate, with thin films formed thereover. The photodiode 150 further comprises a metal electrode 112 formed over the substrate 100, a n-i-p junction photodiode 110 formed over the n-i-p junction photodiode 110. In one embodiment, the metal electrode 112 may include, but not limited to, a material layer of selected from the group consisting of Al, Ag, Ti, Cr, Au, Cu, Pt, alloys thereof, or combinations thereof. Alternatively, the metal electrode 112 may be in form of a composite film having two or more layers formed as the metal electrode 112. In one embodiment, the metal electrode 112 may include a first metal layer 116 and a second metal layer 114. The first metal layer 116 and the second metal layer 114 may be fabricated from a conductive material selected from the group consisting of Al, Ag, Ti, Cr, Au, Cu, Pt, alloys thereof, or combinations thereof. In an exemplary embodiment, the first metal layer 116 is a Ti layer having a thickness between about 100 Å and about 1000 Å and the second metal layer 114 is an aluminum layer having a thickness between about 500 Å and about 3000 Å.

The n-i-p junction photodiode 110 may comprise a n-type amorphous silicon layer 108, an intrinsic-type amorphous silicon layer 106 formed over the n-type amorphous silicon layer 108, and an p-type amorphous silicon layer 104 formed over the intrinsic-type amorphous silicon layer 106. In certain embodiments, the n-type amorphous silicon layer 108 may be formed to a thickness between about 30 Å and about 300 Å, such as between about 50 Å and about 150 Å. In certain embodiments, the intrinsic-type amorphous silicon layer 106 may be formed to a thickness between about 500 Å and about 10,000 Å, such as between about 1000 Å and about 8,000 Å. In certain embodiments, the p-type amorphous silicon layer 104 may be formed to a thickness between about 100 Å and about 400 Å.

Other processes may be performed to form the photodiode 150, such as patterning process and etching processes. Other films, materials, substrates, and/or packaging may be provided over metal electrode 112 to complete the NIP photodiode fabrication. The NIP photodiode may be interconnected to form modules, which in turn can be connected to form arrays.

Optionally, prior to deposition of the n-type layer 108, i-type layer 106 and p-type amorphous silicon layer 104, a hydrogen plasma may be performed to treat the underlying layer to form a treated surface 120 to improve interface adhesion and interfacial film properties.

An transmitting conducting oxide (TCO) layer 102 formed over the n-i-p junction photodiode 110. In one embodiment, the TCO layer 102 may comprise tin oxide, zinc oxide, indium tin oxide (ITO), cadmium stannate, combinations thereof, or other suitable materials. It is understood that the TCO materials may also include additional dopants and components. For example, zinc oxide may further include dopants, such as aluminum, gallium, boron, and other suitable dopants. In one embodiment, zinc oxide may comprise about 5 atomic percent or less of dopants, for example, about 2.5 atomic percent or less aluminum.

An incident light 118 is transmitted through the TCO layer 102 to the intrinsic amorphous silicon layer 106 of the n-i-p junction photodiode 110. The intrinsic amorphous silicon layer 106 is a photosensitive material that may provide high photo sensitivity, e.g., high ratio of photo conductivity to dark current conductivity, in the device structure to improve photodiode device performance.

The photodiode 150 formed on the substrate 100 may have different structural arrangements. For example, the photodiode 150 may be in form of a single i-type layer, p-type layer, or n-type layer sandwiched between the TCO layer 102 and the metal electrode 112. Furthermore, the photodiode 150 may be in form of composite layers having layers selected from any of the i-type layer, p-type layer, or n-type layer, or combinations thereof to be sandwiched between the TCO layer 102 and the metal electrode 112. For example, an i-type and a p-type layer, an i-type and a n-type layer, a p-type and a i-type layer, or a n-type and an i-type layer may be sandwiched between the TCO layer 102 and the metal electrode 112 in any arrangement or configurations. Alternatively, the photodiode 150 may further utilizes an insulating layer in replacement of the p-type layer 104 to be sandwiched between the TCO layer 102 and the i-type layer 106. The insulating layer may be a silicon nitride layer. It is noted that the layers formed between the TCO layer 102 and the metal electrode 112 may have other arrangements or configurations.

Figure 2:
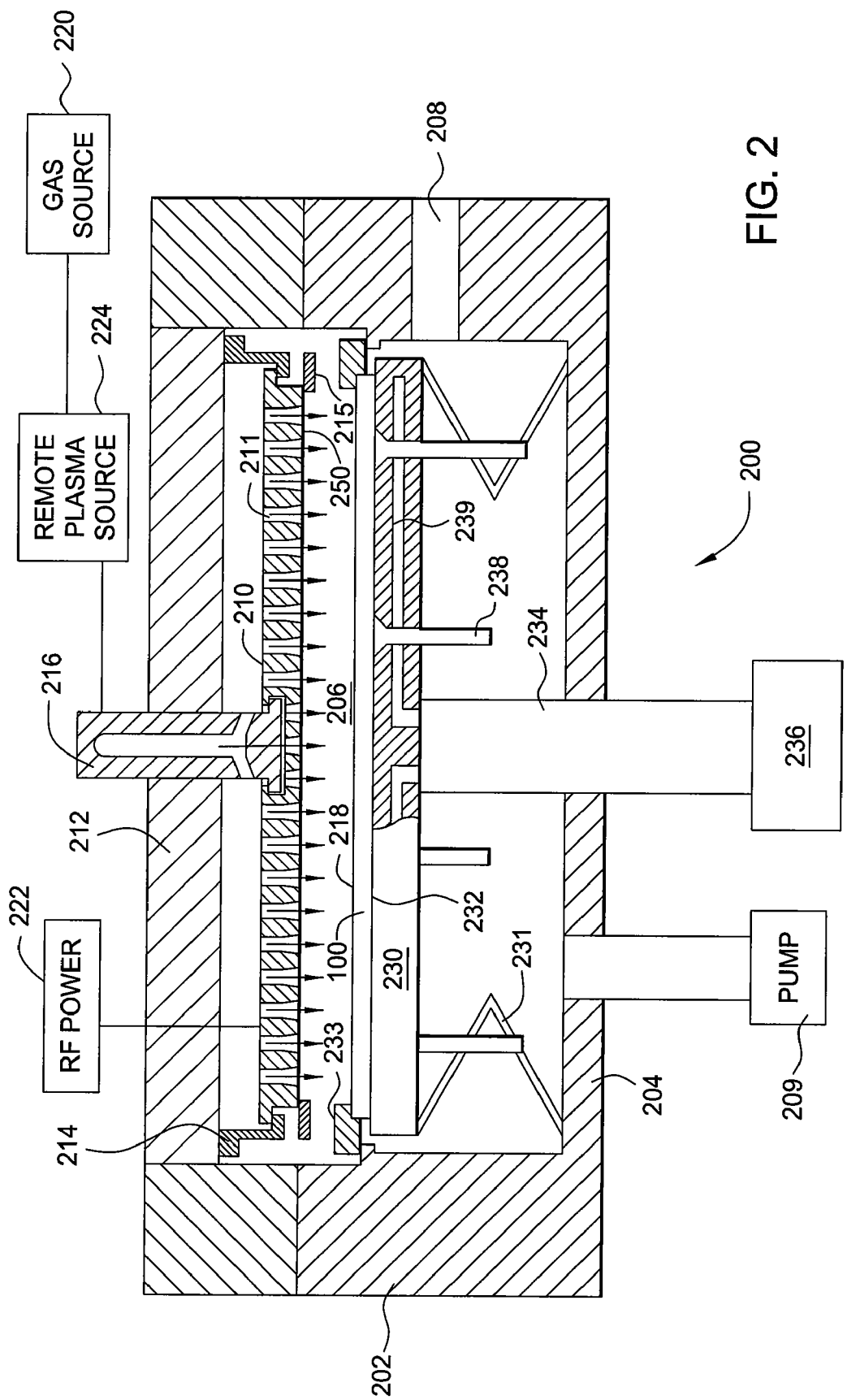
FIG. 2 is a schematic cross-section view of one embodiment of a plasma enhanced chemical vapor deposition (PECVD) chamber in which one or more silicon films of a NIP photodiode may be deposited.

FIG. 2 is a schematic cross-section view of one embodiment of a plasma enhanced chemical vapor deposition (PECVD) chamber 200 in which one or more films of a p-i-n junction photodiode or other large area devices may be formed. One suitable plasma enhanced chemical vapor deposition chamber is available from Applied Materials, Inc., located in Santa Clara, Calif. It is contemplated that other deposition chambers, including those from other manufacturers, may be utilized to practice the present invention.

The chamber 200 generally includes walls 202, a bottom 204 and a lid 212 which bound a process volume 206. A gas distribution plate 210 and substrate support assembly 230 which define a process volume 206. The process volume 206 is accessed through a valve 208 formed through the wall 202 such that a substrate 100 may be transferred in and out of the chamber 200.

The substrate support assembly 230 includes a substrate receiving surface 232 for supporting the substrate 100 thereon and a stem 234. The stem 234 is coupled to a lift system 236 which raises and lowers the substrate support assembly 230 between substrate transfer and processing positions. A shadow frame 233 may be optionally placed over periphery of the substrate 100 when processing to prevent deposition on the edge of the substrate 100. Lift pins 238 are moveably disposed through the substrate support assembly 230 and are adapted to space the substrate 100 from the substrate receiving surface 232. The substrate support assembly 230 may also include heating and/or cooling elements 239 utilized to maintain the substrate support assembly 230 at a desired temperature. The substrate support assembly 230 may also include grounding straps 231 to provide RF grounding around the periphery of the substrate support assembly 230. Examples of grounding straps are disclosed in U.S. Pat. No. 6,024,044 issued on Feb. 15, 2000 to Law et al. and U.S. patent application Ser. No. 11/613,934 filed on Dec. 20, 2006 to Park, et al., which are both incorporated by reference in their entirety.

The gas distribution plate 210 is coupled to a lid 212 or walls 202 of the chamber 200 at its periphery by a suspension 214. The gas distribution plate 210 may also be coupled to the lid 212 by one or more center supports 216 to help prevent sag and/or control the straightness/curvature of the gas distribution plate 210. In one embodiment, the gas distribution plate 210 have different configurations with different dimensions. In an exemplary embodiment, the gas distribution plate 210 is a quadrilateral gas distribution plate. The gas distribution plate 210 has a downstream surface 250 having a plurality of apertures 211 formed therein facing an upper surface 218 of the substrate 100 disposed on the substrate support assembly 230. In one embodiment, the apertures 211 may have different shape, numbers, densities, dimensions, and distributions across the gas distribution plate 210. The diameter of the apertures 211 may be selected between about 0.01 inch and about 1 inch. Examples of gas distribution plates are disclosed in U.S. Pat. No. 6,477,980 issued on Nov. 12, 2002 to White, et al., U.S. Publication No. 20050251990 published on Nov. 17, 2005 to Choi, et al., and U.S. Publication No. 2006/0060138 published on Mar. 23, 2006 to Keller, et al, which are all incorporated by reference in their entirety.

A gas source 220 is coupled to the lid 212 to provide gas through the lid 212, and then through the apertures 211 formed in the gas distribution plate 210 to the process volume 206. A vacuum pump 209 is coupled to the chamber 200 to maintain the gas in the process volume 206 at a desired pressure.

An RF power source 222 is coupled to the lid 212 and/or to the gas distribution plate 210 to provide a RF power that creates an electric field between the gas distribution plate 210 and the substrate support assembly 230 so that a plasma may be generated from the gases between the gas distribution plate 210 and the substrate support assembly 230. The RF power may be applied at various RF frequencies. For example, RF power may be applied at a frequency between about 0.3 MHz and about 200 MHz. In one embodiment the RF power is provided at a frequency of 13.56 MHz.

In one embodiment, the edges of the downstream surface 250 of the gas distribution plate 210 may be curved so that a spacing gradient is defined between the edge and corners of the plate 210 and substrate receiving surface 232 and, consequently, between the plate 210 and the surface 218 of the substrate 100. The shape of the curved surface 250 (e.g., convex, planar or concave) may be selected to meet specific process requirements. Therefore, the edge to corner spacing gradient may be utilized to tune the film property uniformity across the edge of the substrate, thereby correcting property non-uniformity in the corner of the substrate. Additionally, the edge to center spacing may also be controlled so that the film property distribution uniformity may be controlled between the edge and center of the substrate. In one embodiment, a concave curved edge of the gas distribution plate 210 may be used to have the center portion of the edge of the gas distribution plate 210 spaced away from the substrate surface 218 than the corners of the plate 210. In another embodiment, a convex curved edge of the gas distribution plate 210 may be used to have the corners of the gas distribution plate 210 spaced farther than the edges of the distribution plate 210 from the substrate surface 218.

A remote plasma source 224, such as an inductively coupled remote plasma source, may also be coupled between the gas source and the backing plate. Between processing substrates, a cleaning gas may be energized in the remote plasma source 224 to remotely provide plasma utilized to clean chamber components. The cleaning gas may be further excited by the RF power provided to the gas distribution plate 210 by the RF power source 222. Suitable cleaning gases include, but are not limited to, $NF_3$, $F_2$, and $SF_6$. Examples of remote plasma sources are disclosed in U.S. Pat. No. 5,788, 778 issued Aug. 4, 1998 to Shang et al, which is incorporated by reference.

In one embodiment, the substrate 100 that may be processed in the chamber 200 may have a surface area of 10,000 $cm^2$ or more, such as 40,000 $cm^2$ or more, for example about 55,000 $cm^2$ or more. It is understood that after processing the substrate may be cut to form smaller other devices.

In one embodiment, the heating and/or cooling elements 239 may be set to provide a substrate support assembly temperature during deposition of about 400 degrees Celsius or less, for example between about 100 degrees Celsius and about 400 degrees Celsius, or between about 150 degrees Celsius and about 300 degrees Celsius, such as about 200 degrees Celsius.

The nominal spacing during deposition between the upper surface 218 of the substrate 100 disposed on the substrate receiving surface 232 and the gas distribution plate 210 may generally vary between 400 mil and about 1,200 mil, such as between 400 mil and about 800 mil, or other distance across the gas distribution plate 210 to provide desired deposition results. In one exemplary embodiment for a concave downstream surface gas distribution plate 210 is utilized, the spacing between the center portion of the edge of the plate 210 and the substrate receiving surface 232 is between about 400 mils and about 1400 mils and the spacing between the corners of the plate 210 and the substrate receiving surface 232 is between about 300 mils and about 1200 mils.

Figure 3:
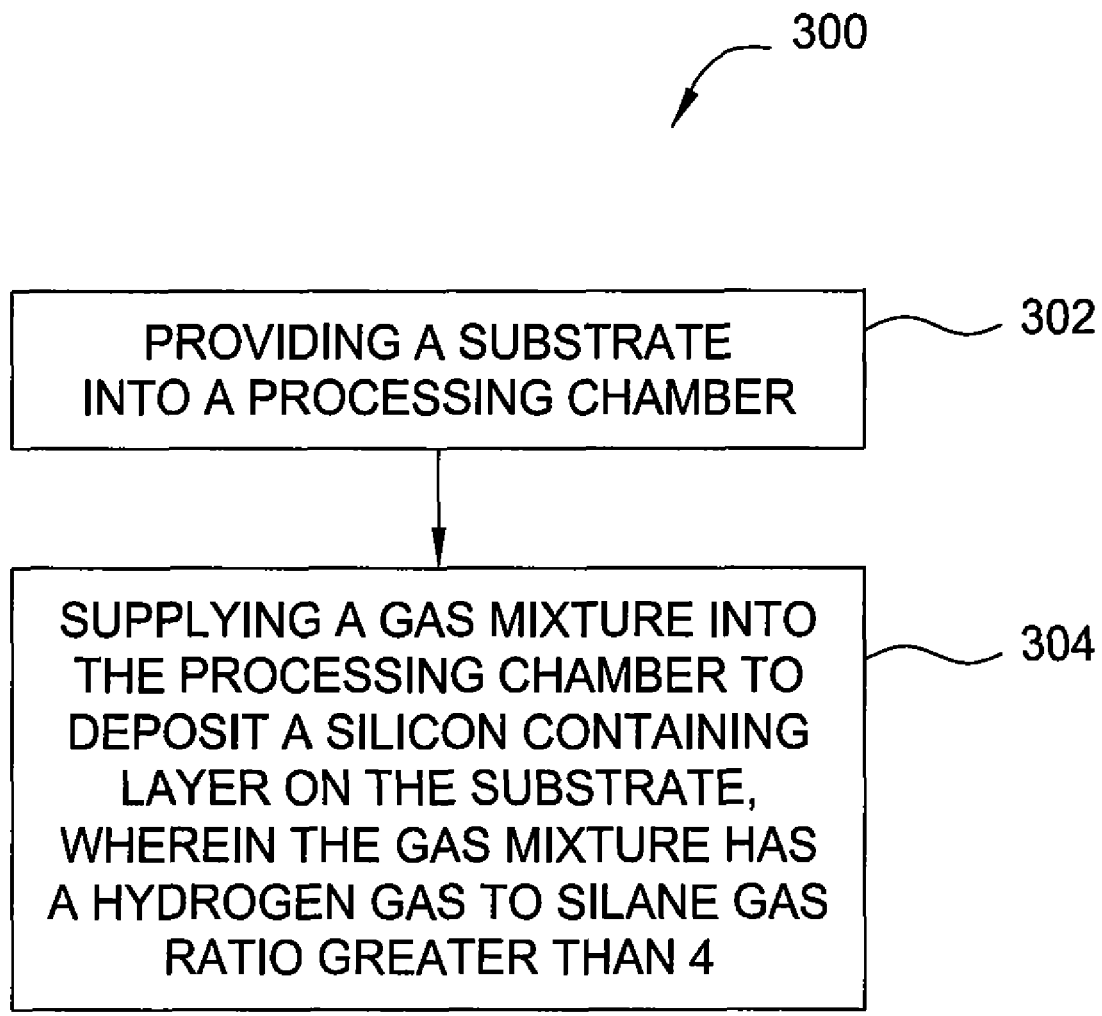
FIG. 3 is a process flow diagram illustrating a method incorporating one embodiment of the invention.

FIG. 3 depicts a flow diagram of one embodiment of a deposition process 300 that may be practiced in the chamber 200, as described in FIG. 2, or other suitable processing chamber. The process 300 illustrates a method of depositing an amorphous based silicon layer. The amorphous based silicon film may be deposited as n-type, p-type, or intrinsic-type amorphous silicon layer, such as the n-type layer 108, p-type layer 104, or intrinsic-type amorphous silicon layer 106, as depicted in FIG. 1, by the selection of the dopant gas used during the deposition process.

The process 300 begins at step 302 by providing the substrate 100 into a process chamber. In the embodiment wherein a n-type amorphous silicon layer, such as the n-type amorphous silicon layer 108 of FIG. 1, is configured to be deposited on the substrate 100, the substrate 100 may have a metal layer 116 previously formed thereon so the to-be-deposited n-type amorphous silicon layer may be deposited over the metal electrode. In the embodiment wherein an intrinsic-type amorphous silicon, such as the intrinsic amorphous silicon layer 106 of FIG. 1, is configured to be deposited on the substrate 100, the substrate 100 may have a metal electrode 112 and a n-type amorphous silicon layer 108 previously formed thereon. In the embodiment wherein a p-type amorphous silicon, such as the p-type amorphous silicon layer 104 of FIG. 1, is configured to be deposited on the substrate 100, the substrate 100 may have a metal electrode 112, a n-type amorphous silicon layer 108 and an intrinsic-type amorphous silicon layer 106 previously formed thereon. It is noted that the substrate 100 may have different films or layers previously formed thereon to facilitate forming different device structures or photodiode on the substrate. In one embodiment, the substrate 100 may be any one of glass substrate, plastic substrate, polymer substrate, metal substrate, or other suitable transparent substrate. In one embodiment, the substrate may have a surface area of 10,000 $cm^2$ or more, preferably 40,000 $cm^2$ or more, and more preferably 55,000 $cm^2$ or more is provided to the chamber. It is understood that after processing the substrate may be cut to form photodiode cells or arrays.

At step 304, a gas mixture is supplied into the processing chamber to deposit an amorphous silicon based layer on the substrate. During deposition, a silicon-based gas and a hydrogen based gas are provided. Suitable silicon based gases include, but are not limited to silane ($SiH_4$), disilane ($Si_2H_6$), silicon tetrafluoride ($SiF_4$), silicon tetrachloride ($SiCl_4$), dichlorosilane ($SiH_2Cl_2$), and combinations thereof. In one embodiment, the silicon-based gas described here is silane ($SiH_4$) gas. Suitable hydrogen-based gases include, but are not limited to hydrogen gas ($H_2$).

In an embodiment wherein the amorphous silicon-based layer is configured to be deposited as a p-type amorphous silicon layer, p-type dopants may be supplied in the gas mixture to form the p-type amorphous silicon layer. The p-type dopants may be selected from a group III element, such as boron or aluminum. In one embodiment, boron is used as the p-type dopant. Examples of boron-containing sources include trimethylboron (TMB), diborane ($B_2H_6$), $BF_3$, $B(C_2H_5)_3$, $BH_3$, $BF_3$, and $B(CH_3)_3$ and similar compounds. In one embodiment, TMB is used as the p-type dopant. The dopants are typically provided with a carrier gas, such as hydrogen, argon, helium, and other suitable compounds. In one embodiment, the gas mixture is provided having hydrogen gas to silane gas ratio by volume between about 4:1 and about 15:1, such as about 6:1. In one embodiment, the hydrogen gas is supplied between about 0.71 sccm/L and about 35.7 sccm/L, such as between about 14.28 sccm/L and about 28.57 sccm/L, for example about 21.42 sccm/L. The silicon based gas is supplied between about 0.71 sccm/L and about 10.71 sccm/L, such as between about 2.14 sccm/L and about 7.14 sccm/L, for example about 4.21 sccm/L. The p-type dopant gas, such as TMB, is supplied between about 0.71 sccm/L and about 7.14 sccm/L, such as between about 1.43 sccm/L and about 5.71 sccm/L, for example about 2.86 sccm/L. The p-type dopant gas may be supplied in the gas mixture about between 0 percent and 0.5 percent molar or volume concentration in a carrier gas. The flow rates in the present disclosure are expressed as sccm per interior chamber volume. Furthermore, methane ($CH_4$) or other carbon containing compounds, such $C_3H_8$, $C_4H_{10}$, $C_2H_2$, can be used to improve the window properties (e.g. to lower absorption of incident light radiation) of p-type amorphous silicon layer. Thus, an increased amount of incident light radiation may be absorbed through the intrinsic layers. In one embodiment, $CH_4$ gas may be supplied in the gas mixture at a flow rate by volume between about 0.71 sccm/L and about 7.14 sccm/L, such as between about 2.14 sccm/L and about 5.71 sccm/L, for example about 4.29 sccm/L.

Several process parameters may be controlled while forming the p-type amorphous silicon layer. In one embodiment, the RF power may be controlled between about 20 milliWatts/$cm^2$ and about 700 milliWatts/$cm^2$, such as about 60 milliWatts/$cm^2$ to the showerhead. The RF powers in the present disclosure are expressed as Watts supplied to an electrode per substrate area. For example, for a RF power of about 10,385 Watts supplied to a showerhead to process a substrate having dimensions of 220 cm×260 cm, the RF power would be 10,385 Watts/(220 cm×260 cm)=180 milliWatts/$cm^2$. The pressure of the chamber may be maintained between about 1 Torr and about 100 Torr, such as between about 1 Torr and about 20 Torr, for example, between 2.5 Torr and about 4 Torr, such as about 2.5 Torr. The deposition rate of the p-type amorphous silicon layer may be about 345 Å/min or more. The deposition time may be controlled between about 0 seconds to about 100 seconds, such as between about 10 seconds to about 50 seconds, for example, about 20 seconds. The spacing is controlled between about 400 mils and about 900 mils and the substrate temperature is controlled between about 100 degrees Celsius and about 400 degrees Celsius, such as about 200 degrees Celsius. The thickness of the p-type amorphous silicon layer is controlled between about 30 Å and about 300 Å, such as between about 50 Å and about 150 Å.

In one embodiment, a hydrogen plasma treatment process may be performed prior to depositing the amorphous based layer, prior to p-type amorphous silicon layer deposition process. The hydrogen plasma treatment process may be performed to treat the substrate to a desired roughness which assists interface film adhesion. In one embodiment, hydrogen treatment process may be performed by supplying hydrogen gas by volume at between about 7.14 sccm/L and about 35.71 sccm/L into the processing chamber. The flow rates in the present disclosure are expressed as sccm per interior chamber volume. The interior chamber volume is defined as the volume of the interior of the chamber in which a gas can occupy. For example, the interior chamber volume of chamber 200 is the volume defined by the lid 212 and by the walls 202 and bottom 204 of the chamber minus the volume occupied therein by the showerhead assembly (i.e., including the gas distribution plate 210, suspension 214, center support 216) and by the substrate support assembly (i.e., substrate support assembly 230, grounding straps 231). In an exemplary embodiment in the present disclosure, the process may be performed at a chamber having a dimension about 600 mm×720 mm and the chamber volume is about 140 litter (L). The RF power may be controlled at between about 50 milliWatts/$cm^2$ and about 200 milliWatts/$cm^2$, such as about 110 milliWatts/$cm^2$, to maintain the hydrogen plasma formed from the hydrogen gas. The treatment time may be controlled between about 10 seconds to about 100 seconds, such as about 30 seconds.

In an embodiment wherein the amorphous silicon based layer is configured to be deposited as an intrinsic-type amorphous silicon layer, a gas mixture including silicon based gas and hydrogen gas may be supplied into the processing chamber for intrinsic-type amorphous silicon layer deposition. In one embodiment, the gas mixture is provided having hydrogen gas to silane gas in ratio by volume between about 4:1 and about 15:1, such as about 12.5:1. In one embodiment, the hydrogen gas is supplied by volume between about 14.28 sccm/L and about 71.42 sccm/L, such as between about 35.71 sccm/L and about 64.28 sccm/L, for example about 53.57 sccm/L. The silicon based gas is supplied by volume between about 0.74 sccm/L and about 10.71 sccm/L, such as between about 2.14 sccm/L and about 7.14 sccm/L, for example about 4.28 sccm/L.

Several process parameters may be controlled while forming the intrinsic-type amorphous silicon layer. In one embodiment, the RF power may be controlled between about 20 milliWatts/$cm^2$ and about 500 milliWatts/$cm^2$, such as about 60 milliWatts/$cm^2$ to the showerhead. The pressure of the chamber may be maintained between about 1 Torr and about 100 Torr, for example, between about 1 Torr and about 20 Torr, such as between 1.5 Torr and about 4 Torr, for example about 2.5 Torr. The deposition rate of the intrinsic-type amorphous silicon layer may be about 216 Å/min or more. The deposition time may be controlled between about 0 seconds to about 1000 seconds, such as between about 100 seconds to about 800 seconds, for example, about 695 seconds. It is noted that the deposition time may be varied based on different deposition rate during processing and different required film thickness. The spacing is controlled between about 600 mils and about 900 mils and the substrate temperature is controlled between about 100 degrees Celsius and about 400 degrees Celsius, such as about 200 degrees Celsius. The thickness of the intrinsic-type amorphous silicon layer is controlled between about 500 Å and about 10,000 Å, such as between about 1000 Å and about 8,000 Å, for example about 5000 Å.

In one embodiment, a hydrogen plasma treatment process may also be optionally performed to treat the surface of the substrate. The hydrogen plasma treatment process may be performed. In one embodiment, hydrogen treatment process may be performed by supplying hydrogen gas by volume at between about 7.14 sccm/L and about 35.71 sccm/L into the processing chamber. The RF power may be controlled at between about 50 milliWatts/$cm^2$ and about 200 milliWatts/ cm², such as about 110 milliWatts/cm² to maintain plasma formed from the hydrogen gas. The treatment pressure may be controlled between about 1 Torr and about 5 Torr, such as about 2 Torr. The treatment time may be controlled between about 10 seconds to about 100 seconds, such as about 15 seconds.

In the embodiment wherein the amorphous silicon based layer is configured to be deposited as a n-type amorphous silicon layer, n-type dopants may be supplied in the gas mixture to form the n-type amorphous silicon layer. The n-type dopants may be a group V element, such as phosphorus, arsenic, or antimony. Examples of phosphorus-containing sources include phosphine and similar compounds. The dopants are typically provided with a carrier gas, such as hydrogen, argon, helium, and other suitable compounds. In the process regimes disclosed herein, individual flow rates of hydrogen gas are provided. Therefore, if a hydrogen gas is provided as the carrier gas, such as for the dopant, the carrier gas flow rate should be viewed independently from the hydrogen gas supplied mainly to react with the silane gas to form the amorphous silicon film.

In one embodiment, the gas mixture used to deposit the n-type amorphous silicon layer is provided having hydrogen gas to silane gas in ratio by volume of between about 4:1 and about 15:1, such as about 5:1. In one embodiment, the hydrogen gas is supplied by volume between about 0.71 sccm/L and about 35.71 sccm/L, such as between about 1.43 sccm/L and about 14.29 sccm/L, for example about 10.71 sccm/L. The silicon based gas is supplied by volume between about 0.71 sccm/L and about 3.57 sccm/L, such as between about 1.07 sccm/L and about 2.86 sccm/L, for example about 2.29 sccm/L. The n-type dopant gas, such as $PH_3$, is supplied by volume between about 0.07 sccm/L and about 3.57 sccm/L, such as between about 0.38 sccm/L and about 2.14 sccm/L, for example about 0.71 sccm/L The n-type dopant gas may be supplied in the gas mixture about between 0% and 0.8% molar or volume concentration in a carrier gas. The flow rates in the present disclosure are expressed as sccm per interior chamber volume. As discussed above, the flow rates in the present disclosure are expressed as sccm per interior chamber volume. The interior chamber volume is defined as the volume of the interior of the chamber in which a gas can occupy. For example, the interior chamber volume of chamber 200 is the volume defined by the lid 212 and by the walls 202 and bottom 204 of the chamber minus the volume occupied therein by the showerhead assembly (i.e., including the gas distribution plate 210, suspension 214, center support 216) and by the substrate support assembly (i.e., substrate support assembly 230, grounding straps 231). In an exemplary embodiment in the present disclosure, the process may be performed at a chamber having a dimension about 600 mm×720 mm and the chamber volume is about 140 litter (L).

Several process parameters may be controlled while forming the n-type amorphous silicon layer. In one embodiment, the RF power may be controlled between about 20 milliWatts/cm² and about 700 milliWatts/cm², such as about 90 milliWatts/cm² to the gas distribution plate. The pressure of the chamber may be maintained between about 1 Torr and about 100 Torr, such as between about 1 Torr and about 20 Torr, for example, between 1.5 Torr and about 4 Torr, such as about 1.5 Torr. The deposition rate of the n-type amorphous silicon layer may be about 513 Å/min or more. The deposition time may be controlled between about 0 seconds to about 500 seconds, such as between about 10 seconds to about 400 seconds, for example, about 300 seconds. The spacing is controlled between about 400 mils and about 900 mils and the substrate temperature is controlled between about 100 degrees Celsius and about 400 degrees Celsius, such as about 200 degrees Celsius. The thickness of the n-type amorphous silicon layer is controlled between about 30 Å and about 500 Å, such as between about 100 Å and about 400 Å, for example between about 300 Å.

Similar to the p-type amorphous silicon, and intrinsic-type amorphous silicon deposition process, a hydrogen treatment process may also be optionally performed to treat the surface of the substrate prior to the n-type amorphous deposition process. The hydrogen plasma treatment process may be performed to treat the substrate. In one embodiment, hydrogen treatment process may be performed by supplying hydrogen gas by volume between about 7.14 sccm/L and about 35.71 sccm/L into the processing chamber. The RF power may be controlled at between about 50 milliWatts/cm² and about 200 milliWatts/cm², such as about 110 milliWatts/cm² to maintain a plasma formed from the hydrogen gas. The treatment pressure may be controlled between about 1 Torr and about 5 Torr, such as about 2 Torr. The treatment time may be controlled between about 10 seconds to about 100 seconds, such as about 30 seconds.

The amorphous silicon-based layer, as described in process 300, provides an enhanced stability of the amorphous silicon layer. The relatively high depositing pressure, greater than 1 Torr, in the process efficiently reduces ion bombardment on the growing surface of the formed silicon layer, thereby lowering ion energy and electron temperature in the plasma and minimizing damage may occur at the p-i-n interface. The relatively high hydrogen dilution, having a ratio by volume of hydrogen to silane greater than about 4, provide high amount of hydrogen atoms that may assist driving out silicon-hydrogen bonding out from the formed amorphous silicon film, thus forming stronger silicon and silicon bonding in the resultant film. The combination of the high pressure and the high hydrogen dilution during the deposition process assists suppressing generation of higher silane related chemical species (HSRS), which is related to the high defect density of the formed material. Unstable electron temperature may adversely affect the degree of photo-induced degradation occurring in the completed devices. Accordingly, by depositing the amorphous silicon-based layer at a process pressure greater than 1 Torr, such as between about 1.5 Torr and about 4 Torr, and having a gas mixture of a hydrogen to silane ratio by volume greater than 4, such as between about 4 and 15, the amorphous-based photodiode will exhibit improved photo sensitivity.

Figure 4A:
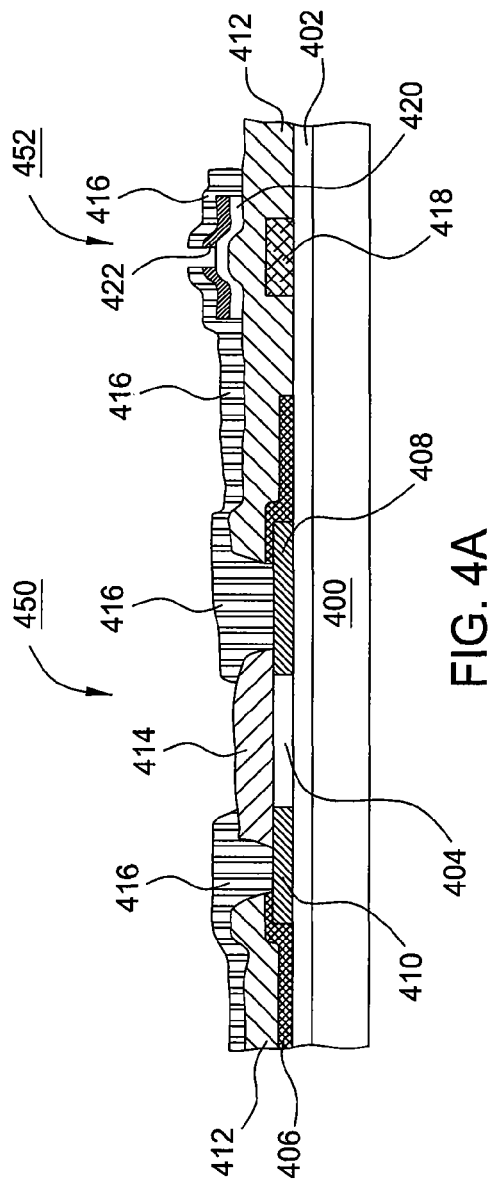
FIG. 4A is a cross-sectional view of a composite structure having NIP photodiode in lateral arrangement and thin film transistors formed by the present invention.
Figure 4B:
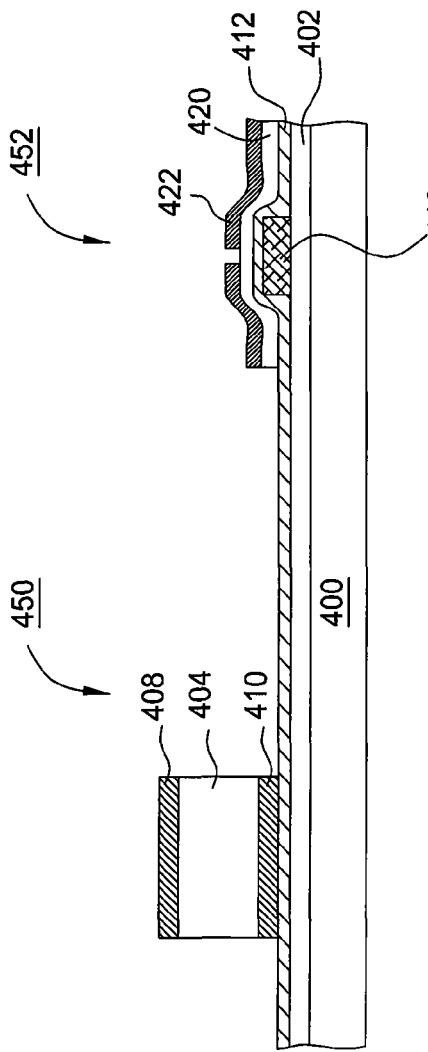
FIG. 4B is a cross-sectional view of a composite structure having NIP photodiode in a vertical arrangement and thin film transistors formed by the present invention.

FIG. 4A and FIG. 4B are cross-sectional views of a composite structure formed on a substrate 400 including NIP photodiode sensor 450 and thin film transistors 452. The NIP photodiode sensor 450 and the thin film transistors 452 may be integrated formed in different regions of the substrate 400 based on the device designs and layouts. The integrated fabrication of NIP photodiode sensors 450 and thin film transistors 452 on a substrate enables a LCD display having a desired optical input function. The NIP photodiode sensor 450 is formed on the substrate 400 having a n-type amorphous silicon layer 410, an intrinsic-type amorphous silicon 404, and a p-type amorphous silicon layer 408 laterally arranged and formed on the substrate 400, as shown in FIG. 4A, or vertically arranged and formed on the substrate 400, as shown in FIG. 4B. It is noted that the n-type amorphous silicon layer 410, the intrinsic-type amorphous silicon 404, and the p-type amorphous silicon layer 408 may be formed in lateral, horizontal, such as the exemplary embodiment of FIG. 4A, or in a stacked, vertical arrangement, such as shown in the exemplary embodiment of FIG. 4B. An insulating layer 402 may be optionally formed on the substrate 400 below the NIP photodiode sensor 450 or the thin film transistor 452. In the exemplary embodiment depicted in FIG. 4A, a first dielectric layer 406 and a second dielectric layer 412 may be formed on the substrate 400 and being patterned into different patterns for different device design requirements. A metallic or dielectric layer 414 may be optionally disposed on the lateral n-type amorphous silicon layer 410, the intrinsic-type amorphous silicon 404, and the p-type amorphous silicon layer 408. The n-type amorphous silicon layer 410, the intrinsic-type amorphous silicon 404, and the p-type amorphous silicon layer 408 may be fabricated from the process 300 described above with referenced to FIG. 3.

In another region different from where the NIP photodiode sensor 450 is formed on the substrate 400 depicted in FIG. 4A, the thin film transistor (TFT) 452 may be formed having a gate electrode layer 418 disposed thereon. The second dielectric layer 412 may be disposed over the gate electrode layer 418 to serve as a gate insulating layer. An amorphous silicon layer 420 and a n-type or a p-type amorphous silicon layer 422 may be subsequently formed on the second dielectric layer 412 to form the transistor 452. An electrode layer 416 may be subsequently formed on the substrate 400 as needed. The amorphous silicon layer 420 and the n-type or p-type amorphous silicon layer 422 may be fabricated from the process 300 described above with referenced to FIG. 3. It is noted that the NIP photodiode sensor 450 and the thin film transistor (TFT) 452 formed on the substrate may be applied and utilized in active matrix liquid crystal display (AMLCD) or an active matrix organic light emitting diodes (AMOLED) devices that have touch screen panel integrated thereto.

Alternatively, the n-type amorphous silicon layer 410, the intrinsic-type amorphous silicon 404, and the p-type amorphous silicon layer 408 may be formed in a stacked and vertical arrangement to form the photodiode sensor 450 on the substrate 400, as shown in the exemplary embodiment of FIG. 4B. Similarly, the thin film transistor 452 may be formed in the other regions of the substrate 400.

Thus, a method of depositing an amorphous silicon-based layer has been provided. The amorphous silicon-based layer may be used in both NIP photodiodes and thin film transistors in display devices. Particularly, amorphous silicon based layer may be used in both NIP photodiodes and thin film transistors in display devices having touch panel embedded and integrated thereto.

While the foregoing is directed to embodiments of the present invention, other and further embodiments of the invention may be devised without departing from the basic scope thereof, and the scope thereof is determined by the claims that follow.

The invention claimed is:

1. A method of depositing an amorphous layer, comprising:
    providing a substrate into a deposition chamber;
    supplying a gas mixture having a hydrogen gas to silane gas ratio by volume greater than 4 into the deposition chamber;
    maintaining a pressure of the gas mixture at greater than about 1 Torr in the deposition chamber; and
    forming an amorphous silicon film on the substrate in the presence of the gas mixture, wherein the amorphous silicon film is configured to be an intrinsic-type layer in a photodiode sensor.

2. The method of claim 1, further comprising:
    performing a hydrogen treatment on the substrate process prior to forming the amorphous silicon film.

3. The method of claim 1, wherein supplying the gas mixture further comprises:
    controlling the ratio by volume of hydrogen gas to the silane gas at between about 4:1 and about 15:1.

4. The method of claim 1, wherein supplying the gas mixture further comprises:
    controlling the ratio by volume of hydrogen gas to the silane gas at about 12.5:1.

5. The method of claim 1, wherein the pressure is maintained at between about 1 Torr and about 20 Torr.

6. The method of claim 1, wherein the pressure is maintained at about 2.5 Torr.

7. A display device comprising a touch panel having the photodiode sensor comprising the amorphous silicon layer deposited by the method of claim 1.

8. The display device of claim 7, comprising:
    a thin film transistor formed on the substrate and integreated with the photodiode sensor.

9. An amorphous-based photodiode sensor, comprising:
    a metal electrode layer disposed on a substrate;
    an n-type amorphous silicon layer disposed on the metal electrode layer;
    an intrinsic type amorphous silicon layer disposed on the n-type amorphous silicon layer, wherein the intrinsic type amorphous silicon layer is deposited from a gas mixture having a hydrogen gas to silane gas ratio by volume greater than 4; and
    a p-type amorphous silicon layer disposed on the intrinsic type amorphous silicon layer, wherein the n-type, intrinsic type and p-type amorphous silicon layers form a photodiode sensor on the substrate.

10. The amorphous-based photodiode sensor of claim 9, wherein the metal electrode is selected from a group consisting of Al, Ag, Ti, Cr, Au, Cu, Pt, alloys thereof and combinations thereof.

11. The amorphous-based photodiode sensor of claim 9, wherein the n-type amorphous silicon layer has a thickness between about 30 Å and about 300 Å.

12. The amorphous-based photodiode sensor of claim 9, wherein the intrinsic-type amorphous silicon layer has a thickness between about 500 Å and about 10,000 Å.

13. The amorphous-based photodiode sensor of claim 9, wherein the p-type amorphous silicon layer has a thickness between about 100 Å and about 400 Å.

14. The amorphous-based photodiode sensor of claim 9, wherein the intrinsic type amorphous silicon layer is formed at a process pressure maintained greater than 1 Torr.

15. The amorphous-based photodiode sensor of claim 9, wherein a hydrogen treatment process is performed prior to forming each n-type, intrinsic type and p-type amorphous silicon layers on the substrate.

16. A display device comprising:
    a touch panel having the photodiode sensor of claim 9.

17. A method of forming an amorphous-based photodiode sensor, comprising:
    forming a n-type amorphous silicon layer on a substrate;
    forming an intrinsic type amorphous silicon layer on the substrate; and
    forming a p-type amorphous silicon layer on the substrate, wherein the n-type amorphous silicon layer, intrinsic type amorphous silicon layer and the p-type amorphous silicon layer are laterally spaced and sequentially formed on the substrate, and the n-type, intrinsic type and p-type amorphous silicon layers form a photodiode sensor on the substrate; wherein the intrinsic type amorphous silicon layer is deposited from a gas mixture having a hydrogen gas to silane gas ratio greater than 4.

18. The method of claim 17, further comprising:
    forming a thin film transistor adjacent to the photodiode sensor on the substrate.

19. The method of claim 17, wherein the intrinsic type amorphous silicon is formed at a process pressure greater than 1 Torr.

* * * * *